(12) United States Patent
Lou et al.

(10) Patent No.: US 12,707,609 B2
(45) Date of Patent: Aug. 11, 2026

(54) AIR-VENT WITH NON-UNIFORM CROSS SECTION FOR EMI SHIELDING

(71) Applicant: Cisco Technology, Inc., San Jose, CA (US)

(72) Inventors: Jianquan Lou, Shanghai (CN); Alpesh U. Bhobe, Sunnyvale, CA (US); Jerrold M. Pianin, Peoria, AZ (US); Xiao Li, Milpitas, CA (US)

(73) Assignee: Cisco Technology, Inc., San Jose, CA (US)

(*) Notice: Subject to any disclaimer, the term of this patent is extended or adjusted under 35 U.S.C. 154(b) by 732 days.

(21) Appl. No.: 18/054,863

(22) Filed: Nov. 11, 2022

(65) Prior Publication Data

US 2023/0156983 A1 May 18, 2023

Related U.S. Application Data

(60) Provisional application No. 63/263,970, filed on Nov. 12, 2021.

(51) Int. Cl.
*H05K 9/00* (2006.01)
*H05K 7/14* (2006.01)

(52) U.S. Cl.
CPC ......... *H05K 9/0041* (2013.01); *H05K 7/1487* (2013.01)

(58) Field of Classification Search
CPC .................................................... H05K 9/0041
USPC .......................................................... 174/383
See application file for complete search history.

(56) References Cited

U.S. PATENT DOCUMENTS

| | | | | |
|---|---|---|---|---|
| 5,928,076 | A | 7/1999 | Clements et al. | |
| 6,063,152 | A | 5/2000 | Teter | |
| 6,838,613 | B2 * | 1/2005 | Kopf | G11B 33/1493 |
| 6,870,092 | B2 * | 3/2005 | Lambert | H05K 9/0041 174/355 |
| 8,507,808 | B2 * | 8/2013 | Xiong | H05K 9/0032 29/512 |
| 2006/0092608 | A1 * | 5/2006 | Liang | H05K 9/0041 361/695 |
| 2011/0299263 | A1 | 12/2011 | Pai et al. | |
| 2015/0342031 | A1 | 11/2015 | Song et al. | |
| 2016/0258545 | A1 | 9/2016 | Gilliland et al. | |

* cited by examiner

*Primary Examiner* — Stanley Tso
(74) *Attorney, Agent, or Firm* — Patterson + Sheridan, LLP

(57) ABSTRACT

Embodiments herein describe air vents that provide air flow for cooling but still provide EMI shielding. In one embodiment, the air vents have a first opening on a first side of a body of a chassis and a second opening on a second, opposite side of the body. These openings form an aperture through the side of the chassis. In addition, the first opening has a smaller diameter than the second opening.

12 Claims, 6 Drawing Sheets

100A
105A
110A
120
$r_o$
$r_i$ 100B
105B
110B
120
$r_o$
$r_i$ 100C
105C
110C
120
$r_o$
$r_i$ 100D
105D
110D
120
$r_o$
$r_i$ 100E
105E
110E
120
$r_o$
$r_i$ 100F
105F
110F
120
$r_{reg}$ 120
100A
105A
120
110A 700
Pressure drop_delta
Horn-Uniform
2
0
-2
-4
-6
-8
-10
Pa
2
3
4
5
6
7
8
Air Flow Velocity(m/s)

AIR-VENT WITH NON-UNIFORM CROSS SECTION FOR EMI SHIELDING

CROSS-REFERENCE TO RELATED APPLICATIONS

This application claims benefit of U.S. provisional patent application Ser. No. 63/263,970 filed Nov. 12, 2021. The aforementioned related patent application is herein incorporated by reference in its entirety.

TECHNICAL FIELD

Embodiments presented in this disclosure generally relate to vent openings with varying cross-sections.

BACKGROUND

Air vents on a computing system chassis are designed to shield unwanted electromagnetic energy, while at the same time allow efficient air flow to cool the system. Vent opening/perforation patterns consisting of straight through holes are typically used to balance electromagnetic interference (EMI) and thermal requirements. There is an inherent conflict between thermal design (calling for larger, less restrictive openings) and electromagnetic shielding (which benefits from smaller openings). With the speed and power consumption of a computing system increasing every product generation, the balance between electromagnetic and thermal requirements has become harder to achieve.

EMI engineers prefer smaller air vent openings to move the cutoff frequency much higher than the operating frequency, while thermal engineers design bigger air vents for more airflow for efficient cooling. The requirements for these two functions are inverse of each other and often reach at different crossroads with every new generation of products that are more power hungry and operate at higher speeds. Modification of shapes of air vent openings with straight through holes have their limitation in terms of EMI/shielding performance.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figures 1A, 1B, 1C, 1D, 1E, 1F:
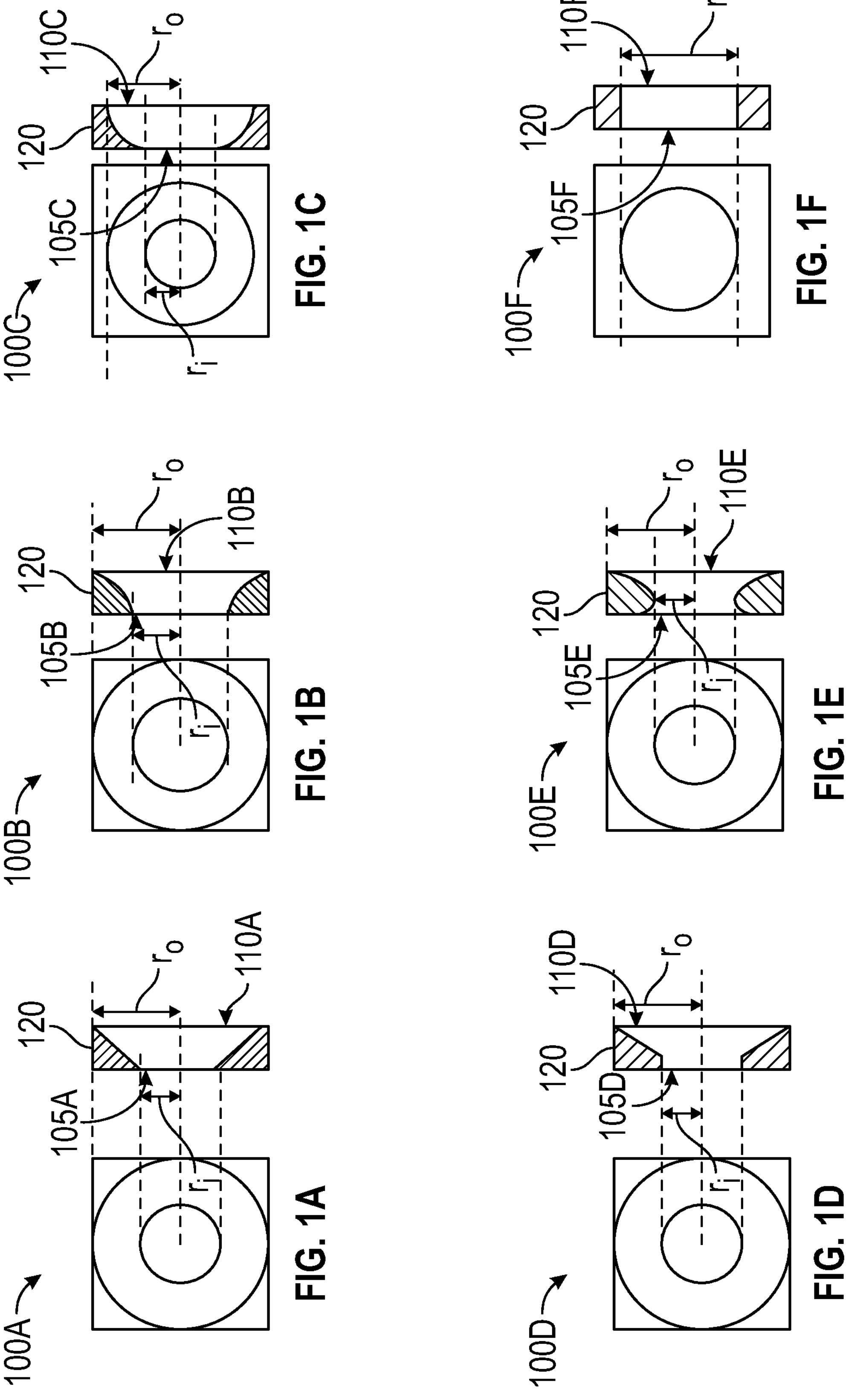
FIGS. 1A-1F illustrate different air vents and their cross sections, according to embodiments herein.

One embodiment presented in this disclosure is a container that includes a body configured to contain a computing system that emits heat and is a source of electromagnetic interference (EMI) and an air vent formed through the body. The air vent configured to enable airflow and absorb the EMI emitted by the computing system. The air vent includes a first opening on a first side of the body and a second opening on a second, opposite side of the body where a diameter of the air vent increases at a non-linear rate when moving from the first opening to the second opening and the first opening has a smaller diameter than the second opening. Moreover, the first and second openings are co-planar with the first and second sides of the body.

Another embodiment presented in this disclosure is a container that includes a body configured to contain a computing system that emits heat and is a source of electromagnetic interference (EMI) and a plurality of air vents formed through the body. The plurality of air vents configured to enable airflow and absorb the EMI emitted by the computing system. Each of the plurality of air vents includes a first opening on a first side of the body and a second opening on a second, opposite side of the body where the first opening has a smaller diameter than the second opening and the second openings for the plurality of air vents contacts a second opening of at least one other of the plurality of air vents.

Example Embodiments

Embodiments herein describe air vents for, e.g., computing systems that provide air flow for cooling but still provide EMI shielding. In one embodiment, the air vents have a first opening on a first side of a panel of a chassis and a second opening on a second, opposite side of the panel. These openings form an aperture through the panel of the chassis. In addition, the first opening has a smaller diameter than the second opening.

The EMI shielding is generally tied to the smallest opening of the air vent. That is, the frequencies shielded (or absorbed) by the air vent generally correspond to the size of the smallest opening in the air vent. However, shrinking the opening typically reduces airflow, thereby having a negative impact on cooling. In the embodiments herein, however, the air vents have openings of different sizes which results in a smaller hole for improved EMI shielding but without any (or minimal) loss in airflow. Alternatively, the air vents can have openings of different sizes which result in the same EMI shielding as an air vent with a uniform radius but provide improved airflow and cooling.

FIGS. 1A-1F illustrate different air vents and their cross sections, according to embodiments herein. The air vents in FIGS. 1A-1F can be implemented on any chassis that includes a heat source which is cooled by air flowing through the air vents. Further, the chassis can contain an EMI emitter or contain EM sensitive components where EMI shielding is desired. As such, the air vents in FIGS.

1A-1F may be made from any material that absorbs EM energy (e.g., an electrical conductor such as metal).

FIG. 1A illustrates a front view and a cross sectional view of an air vent 100A formed in a panel 120 that is part of a body of a chassis. The panel 120 has a thickness where the air vent 100A defines an aperture through the panel 120. In this example, the air vent 100A has a first opening 105A and a second opening 110A where the first opening 105A has a larger radius and diameter than the second opening 110A. Specifically, when moving from the first opening 105A to the second opening 110A, the radius of the air vent 100A increases linearly. As such, the cross section of the air vent 100A forms a trapezoidal shape, and as such, the air vent 100A can be referred to as a trapezoidal air vent.

In FIG. 1A, the radius of the aperture formed by the air vent 100A changes at a linear rate when moving from left to right, and thus, the change in the radius can be expressed as a linear function.

FIG. 1B illustrates a front view and a cross sectional view of an air vent 100B formed in the panel 120 of a chassis. The panel 120 has a thickness where the air vent 100B defines an aperture through the panel 120. In this example, the air vent 100B has a first opening 105B and a second opening 110B where the first opening 105B has a larger radius and diameter than the second opening 110B. Specifically, when moving from the first opening 105B to the second opening 110B, the radius of the air vent 100B increases at a different rate. In this example, the radius increases at a slower rate nearer the first opening 105B but at a faster rate nearer to the second opening 110B. As such, the cross section of the air vent 100B forms a horn, and as such, the air vent 100B can be referred to as a horn air vent.

In FIG. 1B, the radius of the aperture formed by the air vent 100B changes at a varying rate when moving from left to right, and in one embodiment, the change in the radius can be expressed as a parabolic function.

FIG. 1C illustrates a front view and a cross sectional view of an air vent 100C formed in the panel 120 of a chassis. The panel 120 has a thickness where the air vent 100C defines an aperture through the panel 120. In this example, the air vent 100C has a first opening 105C and a second opening 110C where the first opening 105C has a larger radius and diameter than the second opening 110C. Specifically, when moving from the first opening 105C to the second opening 110C, the radius of the air vent 100C increases at a non-linear rate. In this example, the radius increases at a faster rate nearer the first opening 105C but at a slower rate nearer to the second opening 110C. As such, the cross section of the air vent 100C forms a bell shape, and as such, the air vent 100B can be referred to as a bell air vent.

In FIG. 1C, the radius of the aperture formed by the air vent 100C changes at a varying rate when moving from left to right, and in one embodiment, the change in the radius can be expressed as a parabolic function.

FIG. 1D illustrates a front view and a cross sectional view of an air vent 100D formed in the panel 120 of a chassis. The panel 120 has a thickness where the air vent 100D defines an aperture through the panel 120. In this example, the air vent 100D has a first opening 105D and a second opening 110D where the first opening 105D has a larger radius and diameter than the second opening 110D. Specifically, when moving from the first opening 105D to the second opening 110D, the radius of the air vent 100D increases at a linear rate. In this example, the radius remains constant (i.e., does not change) for a first distance through the panel 120. However, the radius then increases until reaching the second opening 110D. In this example, the radius increases in a linear fashion (e.g., at a constant rate) when approaching the second opening 110D. However, in another embodiment, the radius may increase at a varying rate (e.g., like shown in FIG. 1B or FIG. 1C) when approaching the second opening 110D. Thus, FIG. 1D illustrates an air vent 100D where the radius does not always increase when moving from the first opening 105D to the second opening 110D such that a portion of the aperture of the air vent 100D has the same radius.

FIG. 1E illustrates a front view and a cross sectional view of an air vent 100E formed in the panel 120 of a chassis. The panel 120 has a thickness where the air vent 100E defines an aperture through the panel 120. In this example, the air vent 100E has a first opening 105E and a second opening 110E where the first opening 105E has a larger radius and diameter than the second opening 110E. Specifically, when moving from the first opening 105E to the second opening 110E, the radius decreases for a first distance through the panel 120 and then increases until reaching the second opening 110E. The radius of the air vent 100E can decrease and increase at a constant rate, or at a varying rate.

The first opening 105E for the air vent 100E may have a larger radius and diameter than the first openings 105A-D for the air vents 100A-D. In the air vents 100A-D the first openings 105A-D corresponded to the portion of the aperture formed by the air vents 100A-D that had the smallest radius. In contrast, the portion of the aperture formed by the air vent 100E with the smallest radius or diameter is in the interior of the panel 120. In either case, the amount of EMI shielding provided by the air vents 100A-E is determined by the portion of the aperture with the smallest radius. If the smallest portions of the apertures formed by the air vents 100A-E have the same radius, then the EMI shielding provided by the air vents 100A-E is substantially the same, regardless if the portions of the apertures with the smallest radius is at an opening as is the case for the air vents 100A-D or in the interior of the panel 120 as is the case for the air vent 100E. The radius $r_i$ illustrates the portions of the air vents 100A-E with the smallest radius while the radius $r_o$ illustrates the portions of the air vents 100A-E with the largest radius.

The concept of non-uniform vent openings as shown in the air vents 100A-E can work for any geometrical function of the radius—i.e., the vent openings have improved EMI shielding relative to uniform openings. But for simplicity in manufacturing it may be desired to use a function in which the radius only increases (or decreases) from one panel to the other.

Further, the air vents 100A-E in FIGS. 1A-1E illustrates circular openings, but other shapes are also possible. For example, the openings could be rectangular, oval, triangular, pentagonal, hexagonal, or any polygon shapes.

In one embodiment, the thickness of the panel 120 (and the width of the air vents) is between 0.5 and 2.5 mm. In one embodiment, the thickness of the panel 120 (and the width of the air vents) is between 0.75 and 1.5 mm.

In one embodiment, the radius of the (small) first openings 105A-E is between 0.5 to 3 mm. In another embodiment, the radius of the (small) first openings 105A-E is between 0.1 to 2 mm. However, the radius of the first openings 105 can vary depending on the frequency of the signals being shielded or absorbed. If the air vents are to be used in a system with higher frequency EMI, then the smaller openings 105 may be smaller than air vents used in the presence of lower frequency EMI.

In one embodiment, the radius of the (large) second openings 110A-E is between 0.5 to 3 mm. In another embodiment, the radius of the (small) first openings 105A-E is between 0.1 to 2 mm. In one embodiment, the difference between the radiuses of the first and second openings is between 0.01 and 0.1 mm. In another embodiment, the difference between the radiuses of the first and second openings is between 0.04 and 0.08 mm. As one non-limiting example, the radius of the first opening 105 may be 1.61 mm while the radius of the second opening 110 is 1.67 mm for a radius difference of 0.06 mm between the two openings.

FIG. 1F illustrates a front view and a cross sectional view of an air vent 100F formed in the panel 120 of a chassis. The panel 120 has a thickness where the air vent 100F defines an aperture through the panel 120. In this example, the air vent 100F has a first opening 105F and a second opening 110F with the same radius and diameter. Specifically, when moving from the first opening 105F to the second opening 110F, the radius of the air vent 100F is constant, thereby forming an aperture with a cylindrical shape.

As can be seen by comparing the air vent 100F to the air vents 100A-E, the air vents 100A-E have second openings 110A-E that have the same radius or diameter as the radius or diameter of the air vent 100F. However, the air vents 100A-E have portions with a much smaller radiuses than the radius of the air vent 100F. As mentioned above, the amount of EMI shielding provided by the air vents 100A-F is primarily determined by the smallest radius of the air vents 100A-F. As such, the air vents 100A-E provide greater EMI shielding than the air vent 100F since their smaller radius will absorb higher frequency EM signals than the larger radius of the air vent 100F.

Moreover, the cross sectional shapes of the air vents 100A-E result in them having substantially equal air flow properties as the air vent 100F. That is, despite the air vents 100A-E having portions with a smaller radius, the cross sectional shape still permit substantially the same air flow, and thus, have the same cooling benefits as the air vent 100F. Thus, the air vents 100A-E have improved EMI shielding than air vent 100F but still have similar air flow properties as the air vent 100F.

In one embodiment, the air vents 100A-E do not have any protrusions. That is, the air vents 100 are contained within the width of the panel 120 (e.g., a panel of a chassis). For example, a milling or laser cutting process can be used to form the air vents 100A-E within the panel 120. As shown, the first and second openings 105 and 110 of the air vents 100A-E are co-planar with respective sides of the panel 120. That is, the first openings 105A-E are co-planar with a first side of the panel 120 while the second openings 110A-E are co-planar with a second side of the panel 120 which is opposite the first side. As such, in the embodiments illustrated in FIGS. 1A-1E the air vents 100 do have portions that protrude from the panel 120. In one embodiment, the entirety of the air vent 100 is contained within the panel 120. Thus, the air vents 100 can be formed by cutting apertures through a flat panel 120 without adding any conical or other shaped protrusions to the panel.

In one embodiment, the air vents 100A-E can be covered with an EMI coating that can improve their EMI shielding properties. For example, the EMI coating can be deposited on both sides of the panel 120.

Figure 2:
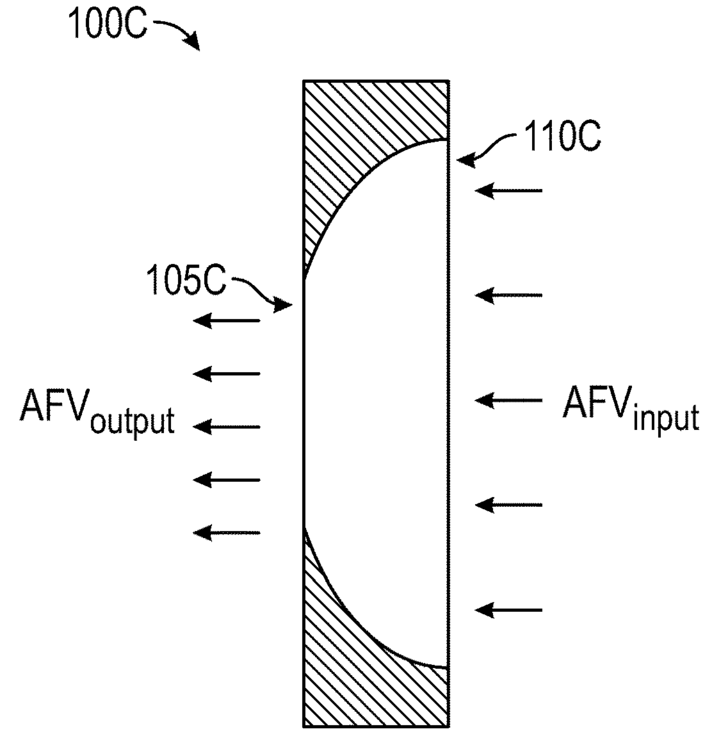
FIG. 2 illustrates airflow through an air vent, according to one embodiment herein.

FIG. 2 illustrates airflow through the air vent 100C in FIG. 1C, according to one embodiment herein. FIG. 2 illustrates that the air flow volume (AFV) into the air vent 100C (i.e., $AFV_{input}$) and the AFV out of the air vent 100C (i.e., $AFV_{output}$). FIG. 2 illustrates that the AFV into the air vent 100C is essentially the same as the AFV out of the air vent 100C, indicating that the smaller radius of the first opening 105C has little to no impact of the air flow through the air vent 100C. That is, $AFV_{input}$ is approximately the same as air flow volume output $AFV_{output}$.

The principle illustrated in FIG. 2 can also apply to the other air vents with non-uniform radiuses illustrated in FIGS. 1A-1E.

Figure 3A:
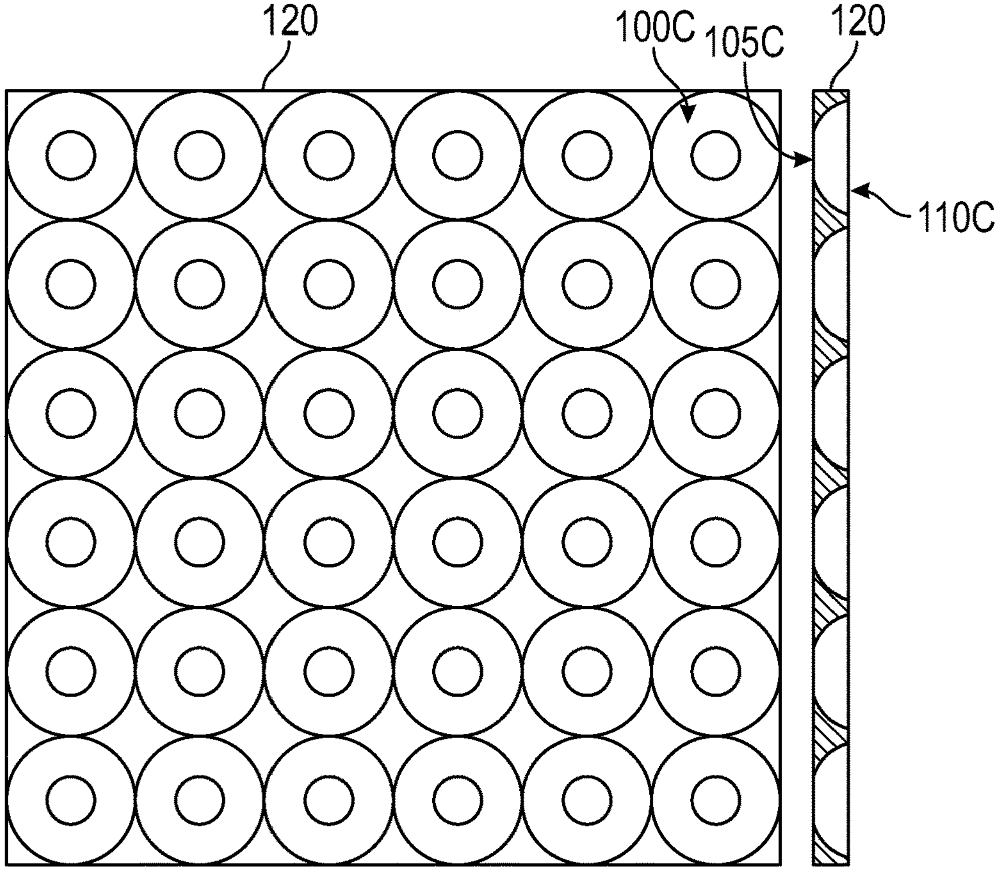
FIGS. 3A-3C illustrate chassis sides containing a plurality of air vents, according to embodiments herein.
Figures 3B, 3C:
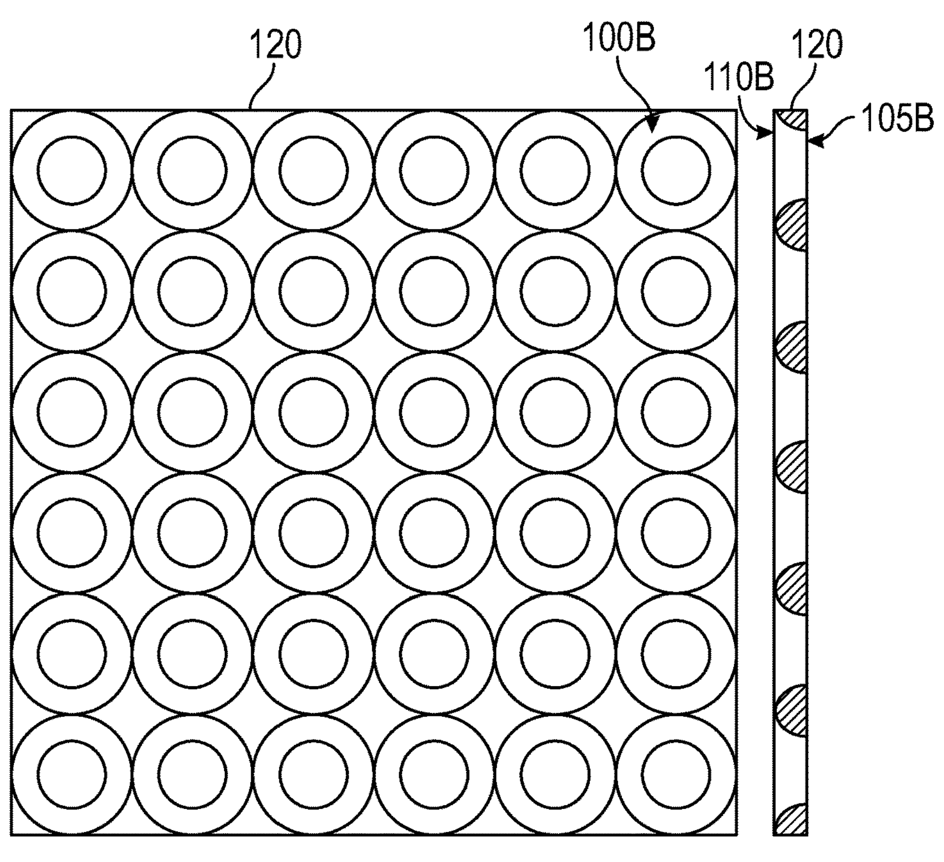

FIGS. 3A-3C illustrate chassis panels containing a plurality of air vents, according to embodiments herein. FIG. 3A illustrates a front view and a cross sectional view of the panel 120 that contains a plurality of the air vents 100C illustrated in FIG. 1C. FIG. 3B illustrates a front view and a cross sectional view of the panel 120 that contains a plurality of the air vents 100B illustrated in FIG. 1B. FIG. 3C illustrates a front view and a cross sectional view of the panel 120 that contains a plurality of the air vents 100A illustrated in FIG. 1A. The air vents 100 in FIGS. 3A-3C create a web or webbing of air vents.

In FIGS. 3A-3C, the individual air vents 100 have second openings 110 that contact second openings 110 for neighboring air vents 100. However, in other embodiments, there may be a small spacing between the second openings 110 of neighboring air vents 100. For example, the spacing between the second openings 110 of neighboring air vents 100 may range from 0 to 5 mm.

Minimizing the spacing between the second openings 110 can increase the density of the air vents 100 in the panel 120 which may in turn improve air flow and cooling. However, the air vents 100 reduce the structural integrity of the panel 120. Thus, the number of air vents 100 in the panel 120 can be a tradeoff with maintaining the strength of the panel 120.

Further, increasing the radius or diameter of the largest opening in the air vents (the second openings 110A-C in the examples illustrated in FIGS. 3A-3C) means the radius or diameter of the smaller opening can be reduced without having a negative impact on the airflow or cooling properties. Thus, by increasing the diameter of the second openings 110, the diameters of the first openings 105 can be reduced which, as discussed above, improves the EMI shielding of the air vents.

However, increasing the size of the second openings 110 reduces the density of the air vents 100. Put differently, the number of air vents 100 that can be placed on the panel 120 is reduced as the diameter of the second openings 110 is increased. Thus, the size of the second openings 110 can be balanced between the desired density of the air vents on the panel 120 and the EMI shielding. For example, the designer may know the frequencies of the EMI that should be blocked or absorbed by the air vent and can set the size of the smaller opening to block those frequencies. The size of the larger opening can then be set according to the desired air flow through each air vent and the desired density of the air vents 100 on the panel 120.

Figure 4:
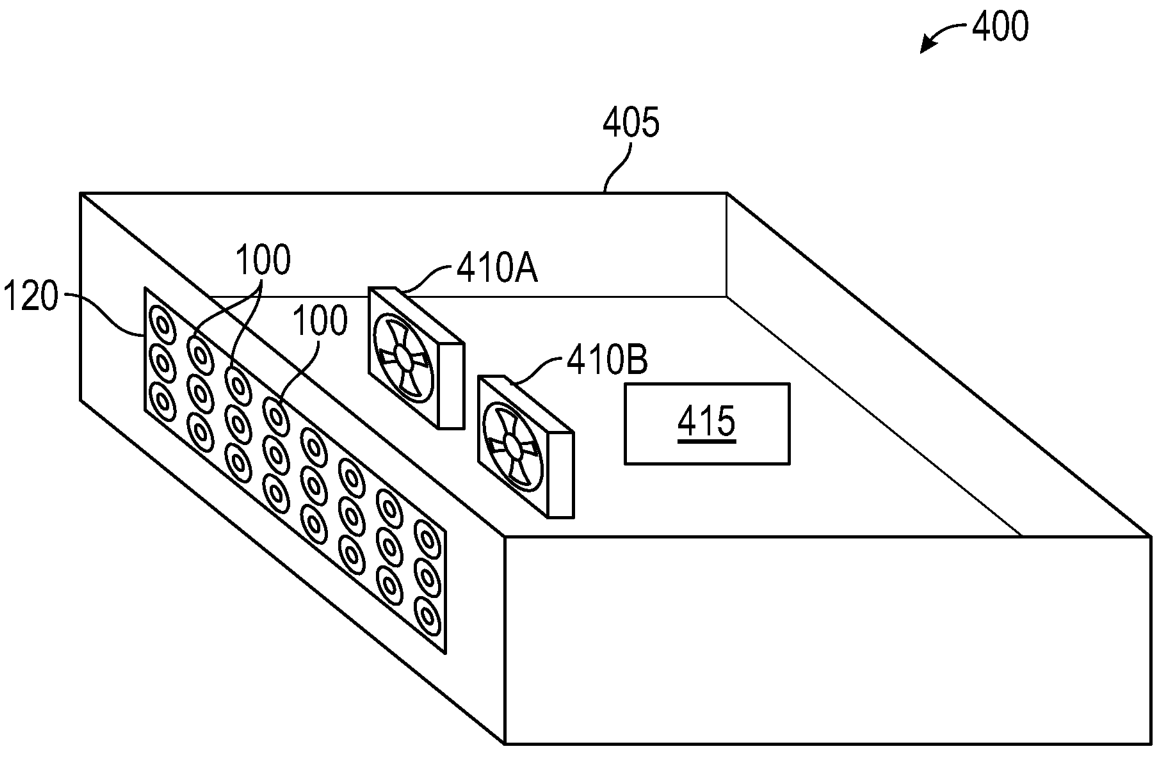
FIG. 4 is a computing system chassis with a side containing a plurality of air vents, according to embodiments herein.

FIG. 4 is a computing system 400 with a chassis 405 (e.g., a container) having a body with at least one panel 120 with a plurality of air vents 100, according to embodiments herein. For example, the air vents 100 can be any of the designs illustrated in FIGS. 1A-1E above. Further, the openings of the air vents 100 can be circular, oval, triangular, rectangular, etc.

In this example, the chassis 405 contains fans 410 and an EM emitter 415. The fans 410 may be arranged in the chassis 405 to cool the air in the chassis by pushing or pulling air through the air vents 100. The chassis 405 can include any number of fans 410.

The EM emitter 415 can include a computing system that emits undesirable EMI. For example, the computing system 400 may be disposed in a data center with other computing systems. To prevent the EMI generated by the EM emitter 415 from escaping, the chassis 405 can include the air vents 100 which are designed to absorb the EMI signals emitted by the EM emitter 415 to prevent them from affecting other computing devices in the same shared space.

In one embodiment, the EM emitter 415 is also the source of heat which heats the air in the chassis 405. The fans 410 may be tasked with cooling the EM emitter 415. In other embodiments, the chassis 405 may include other heat sources which are cooled by the fans 410 and the air flowing through the air vents 100.

Additionally or alternatively, the computing system 400 can include EM sensitive computing components which can be negatively impacted by EMI that may enter into the chassis 405. In that case, the air vents 100 can be designed to absorb the EM at the frequencies that affect the EM sensitive computing components. Thus, the air vents 100 can be used to prevent EMI from being emitted from the chassis 405 as well as prevent EMI from entering into the chassis 405, while enabling the interior of the chassis 405 to be cooled.

Although the air vents 100 are disposed on one panel of the body of the chassis 405, the air vents 100 can be disposed on any number of panels of the chassis body. The panels of the chassis 405 that do not have the air vents can be solid sheets (without holes) of conductive material (e.g., metal) to prevent EMI from leaving or entering the chassis 405.

In some embodiments, the computing system 400 may be a server, server node, expansion box, or a networking device (e.g., router or switch).

Figure 5A:
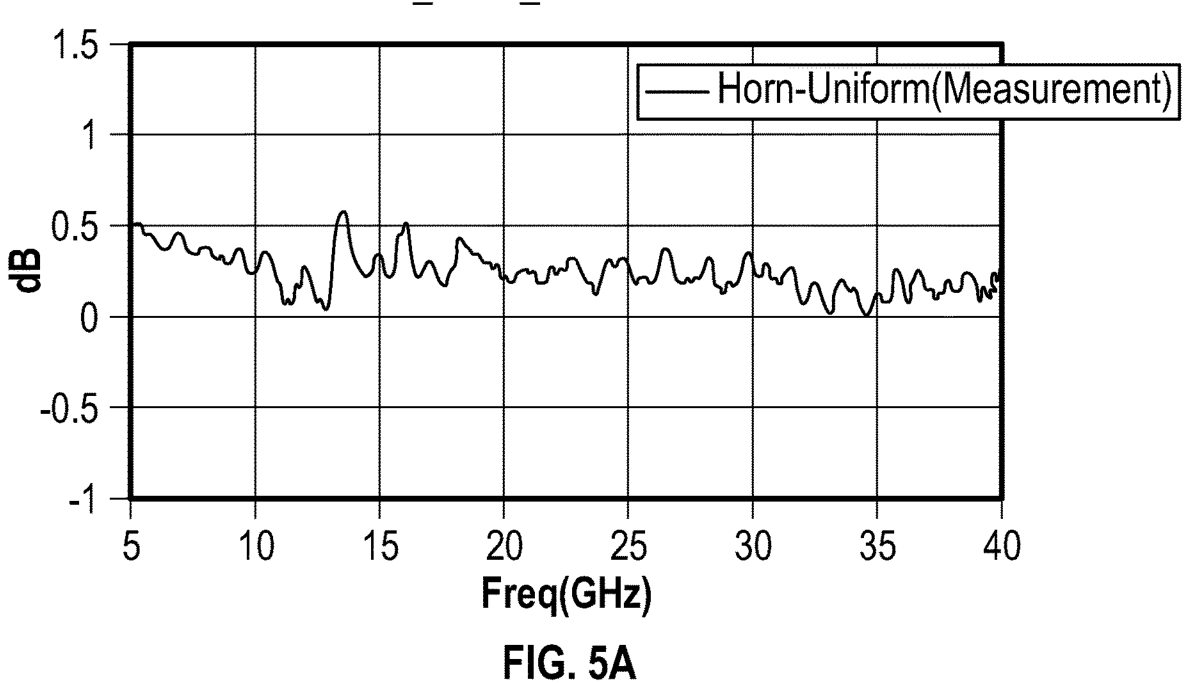
FIGS. 5A and 5B illustrate measurement and simulation data for air vents, according to embodiments herein.
Figure 5B:
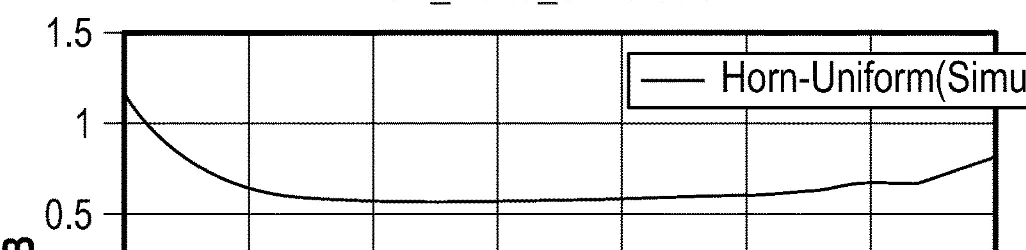

FIGS. 5A and 5B illustrate measurement and simulation data for air vents, according to embodiments herein. FIG. 5A includes a chart 500 illustrating measurements captured by testing a uniform air vent (i.e., the cylindrical shaped air vent 100F in FIG. 1F) and a horn air vent (i.e., the air vent 100B in FIG. 1B). The radius of the uniform air vent used to capture the data illustrated in FIGS. 5A and 5B is 1.64 mm and the radius of the small opening of the horn air vent is 1.6 mm and the radius of the larger opening of the horn air vent is 1.67 mm. The thickness of the panel in which the uniform and horn air vents are formed is 1 mm.

The chart 500 in FIG. 5A illustrates the shielding effectiveness (SE) of the uniform and horn air vents as measured in a testing environment. Specifically, chart 500 illustrates the delta or difference between the SE of the uniform air vent and the SE of the horn air vent. This measured test data indicates the horn air vent has up to a 0.5 dB improvement in EMI shielding compared to the uniform air vent.

The chart 550 in FIG. 5B illustrates the SE of the uniform and horn air vents as simulated in a simulator. Like the chart 500, the chart 550 illustrates the delta between the SE of the uniform air vent and the SE of the horn air vent. This simulated data indicates the horn air vent can have over a 1 dB improvement at lower frequencies and has over an 0.5 dB improvement for all frequencies in the frequency range on the X-axis. Thus, FIGS. 5A and 5B illustrate that the horn air vent has improved EMI shielding relative to a similarly sized uniform air vent.

Figures 6, 7:
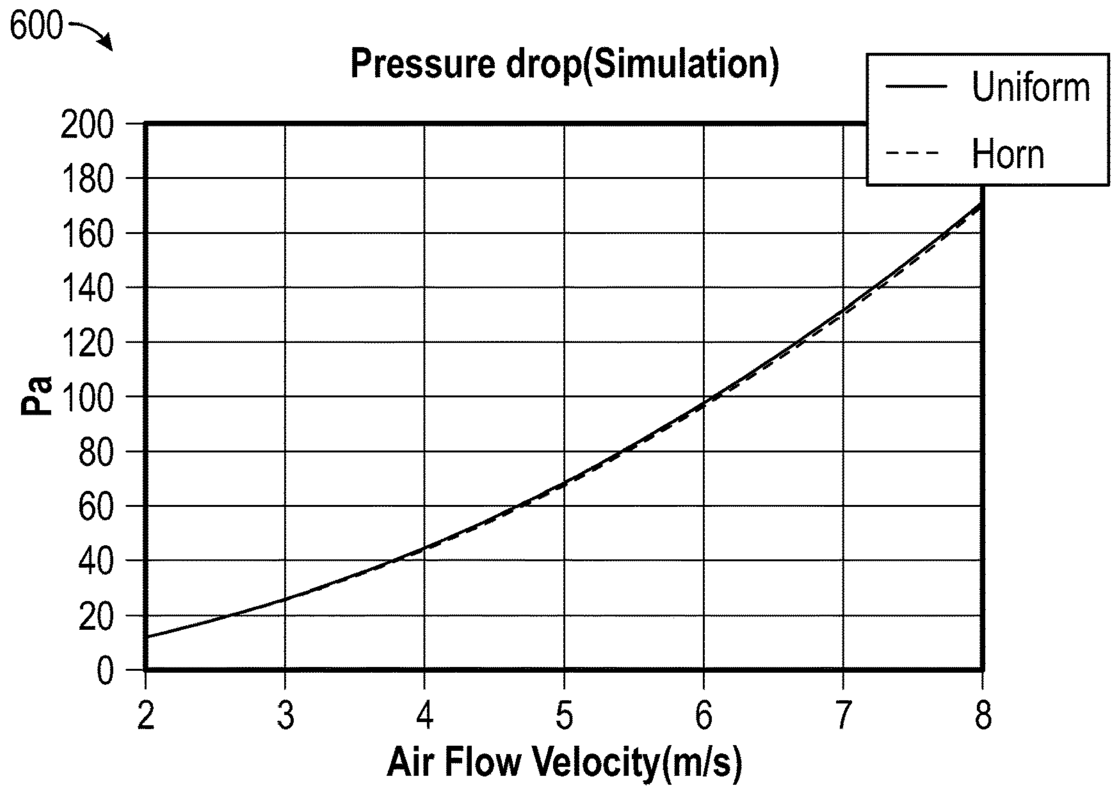
FIG. 6 illustrates pressure drop data for air vents, according to one embodiment herein.
FIG. 7 illustrates pressure drop data for air vents, according to one embodiment herein.

FIG. 6 illustrates pressure drop data for air vents, according to one embodiment herein. FIG. 6 includes a chart 600 illustrating simulation data captured by simulating the air flow through a uniform air vent (i.e., the cylindrical shaped air vent 100F in FIG. 1F) and a horn air vent (i.e., the air vent 100B in FIG. 1B). The dimensions of the uniform air vent and horn air vent used to capture the simulated data illustrated in FIGS. 6 and 7 are the same as used to capture the data shown in FIGS. 5A and 5B.

As shown, the chart 600 illustrates that the pressure (Y-axis) across the uniform and horn air vents for different air velocities (X-axis) is essentially unchanged, especially at lower air velocities. For example, below 5 m/s, the pressure across the two types of air vents is approximately the same while there is some difference in the pressure at velocities above 5 m/s.

FIG. 7 illustrates pressure drop data for air vents, according to one embodiment herein. The chart 700 illustrates the delta or difference between the air pressure across the uniform air vent and the air pressure across the horn air vent. The chart 700 is based on the simulated data illustrated in the chart 600 in FIG. 6.

As shown, the difference in air pressure between the uniform and horn air vents is essentially zero for air flow velocities below 5 m/s. This means that the cooling characteristics of the air vents as it relates to air flow and pressure is essentially the same for the two types of air vents. However, as mentioned above in charts 500 and 550 in FIGS. 5A and 5B, the horn air vent offers a 0.5-1 dB improvement in EMI shielding. Thus, using the horn air vent has a negligible or no adverse impact on cooling but offers an appreciable improvement for EMI shielding. A similar improvement is offered by the other air vents illustrated in FIGS. 1A-1E.

Figure 5B:
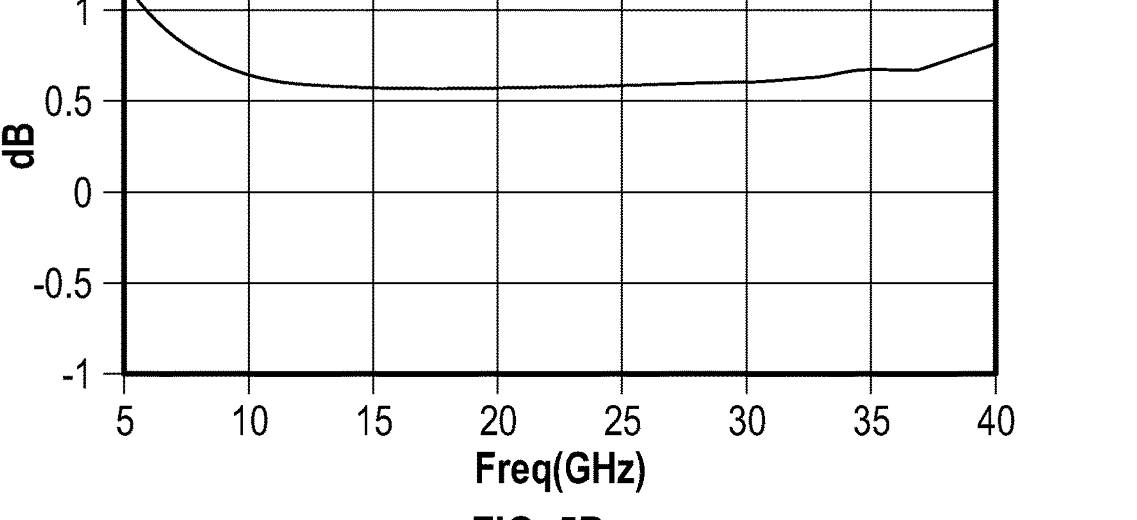

Further, while FIGS. 5-7 illustrate that switching from the uniform air vent to a horn air vent can offer improved EMI shielding without sacrificing air flow, switching from the uniform air vent to the horn air vent can offer improved air flow without sacrificing EMI shielding. For example, when switching from the uniform air vent to the horn air vent, the radius of the smaller opening of the horn air vent may be set to be equal to the radius of the uniform air vent, thereby ensuring the EMI shielding of the two vents are approximately equal. But by switching to the horn shape, the airflow through the horn air vent is improved relative to the airflow of the uniform air vent due to the non-uniform radius of the horn air vent (e.g., the horn air vent can achieve greater pressure difference than the uniform air vent).

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A container, comprising:

a body configured to contain a computing system that emits heat and is a source of electromagnetic interference (EMI); and an air vent formed through the body, the air vent configured to enable airflow and absorb the EMI emitted by the computing system, the air vent comprising:

a first opening on a first side of the body and a second opening on a second, opposite side of the body, wherein a diameter of the air vent increases at a non-linear rate when moving from the first opening to the second opening, wherein the first opening has a smaller diameter than the second opening, wherein the first and second openings are co-planar with the first and second sides of the body, wherein a cross section of the air vent is a horn or bell shape, and wherein the horn or bell shape is symmetrical about a central axis with respect to a surface of the container, and wherein the diameter of the air vent continuously increases from the first opening to the second opening.

2. The container of claim 1, wherein the air vent does not protrude from the body.

3. The container of claim 1, further comprising a plurality of air vents in the side of the body, each of the plurality of air vents comprising the first opening on the first side of the body and the second opening on the second, opposite side of the body.

4. The container of claim 3, wherein the second openings for the plurality of air vents are spaced apart from a second opening of at least one other of the plurality of air vents by a distance of 0-5 mm.

5. The container of claim 1, wherein a width of the air vent is less than 0.5 mm.

6. The container of claim 1, wherein a difference between a first radius of the first opening and a second radius of the second opening is between 0.01 to 0.1 mm.

7. The container of claim 1, wherein a difference between a first radius of the first opening and a second radius of the second opening is between 0.04 and 0.08 mm.

8. A container, comprising:

a body configured to contain a computing system that emits heat and is a source of electromagnetic interference (EMI); and a plurality of air vents formed through the body, the plurality of air vents configured to enable airflow and absorb the EMI emitted by the computing system, each of the plurality of air vents comprising:

a first opening on a first side of the body and a second opening on a second, opposite side of the body, wherein the first opening has a smaller diameter than the second opening, wherein the second openings for the plurality of air vents contacts a second opening of at least one other of the plurality of air vents, wherein a diameter of each of the plurality of air vents increases at a non-linear rate when moving from the first opening to the second opening, wherein a cross section of the plurality of air vents is a horn or bell shape, and wherein the horn or bell shape is symmetrical about a central axis with respect to a surface of the container, and wherein the diameter of at least one air vent of the plurality of air vents continuously increases from the first opening to the second opening.

9. The container of claim 8, wherein the plurality of air vents do not protrude from the body.

10. The container of claim 8, wherein a width of the plurality of air vents is less than 0.5 mm.

11. The container of claim 8, wherein a difference between a first radius of the first opening and a second radius of the second opening in each of the plurality of air vents is between 0.01 to 0.1 mm.

12. The container of claim 8, wherein a difference between a first radius of the first opening and a second radius of the second opening in each of the plurality of air vents is between 0.04 and 0.08 mm.

* * * * *